United States Patent
Peralta et al.

(10) Patent No.: US 11,016,133 B2
(45) Date of Patent: May 25, 2021

(54) ARC FAULT DETECTION WITH SENSE WIRE MONITORING

(71) Applicant: Hamilton Sundstrand Corporation, Charlotte, NC (US)

(72) Inventors: Jimmy Peralta, Rockford, IL (US); John A. Dickey, Caledonia, IL (US)

(73) Assignee: HAMILTON SUNSTRAND CORPORATION, Charlotte, NC (US)

(*) Notice: Subject to any disclaimer, the term of this patent is extended or adjusted under 35 U.S.C. 154(b) by 228 days.

(21) Appl. No.: 16/217,817

(22) Filed: Dec. 12, 2018

(65) Prior Publication Data
US 2020/0191853 A1 Jun. 18, 2020

(51) Int. Cl.
*G01R 31/08* (2020.01)
*G01R 31/00* (2006.01)
(Continued)

(52) U.S. Cl.
CPC ..... *G01R 31/085* (2013.01); *G01R 19/16528* (2013.01); *G01R 31/008* (2013.01); *B64F 5/60* (2017.01)

(58) Field of Classification Search
CPC .......... H02H 3/30; H02H 1/0015; H02H 3/44; H02H 1/06; H02H 3/006; H02H 3/16; H02H 3/28; H02H 7/205; H02H 7/263; H02H 7/268; G01R 31/008; G01R 31/1272; G01R 31/086; G01R 31/14; G01R 31/50; G01R 31/52; G01R 31/58; G01R 15/16;
(Continued)

(56) References Cited

U.S. PATENT DOCUMENTS 4,959,792 A * 9/1990 Sullivan ................ G01R 31/58
702/58
5,185,684 A 2/1993 Beihoff et al.
(Continued)

FOREIGN PATENT DOCUMENTS

DE 10319456 A1 11/2004
EP 0824776 B1 9/2000
(Continued)

OTHER PUBLICATIONS

European Search Report for Application No. 19215129.8, dated Apr. 28, 2020, 9 pages.
(Continued)

*Primary Examiner* — Lee E Rodak
(74) *Attorney, Agent, or Firm* — Cantor Colburn LLP

(57) ABSTRACT

A method of identifying an arc fault in a wire operably connected between a controller and a load. The method includes operably connecting a sense wire to the wire in close proximity to a load supplied by the controller via the wire, measuring a first voltage on the wire at the load via the sense wire, measuring a second voltage on the wire at an output interface of the controller and measuring a current in the first wire. The method also includes identifying any differences between the voltage on the wire measured at the load and the second voltage on the wire measured at the output interface, ascertaining any anomalies in the current measured in the wire, and correlating the differences between the first voltage and the second voltage with any anomalies in the current to identify an arc fault.

26 Claims, 6 Drawing Sheets

(51) Int. Cl.
*G01R 19/165* (2006.01)
*B64F 5/60* (2017.01)

(58) Field of Classification Search
CPC ............ G01R 15/207; G01R 19/16528; G01R 31/025; G01R 31/085; G01R 31/42; G01R 31/54
See application file for complete search history.

(56) References Cited

U.S. PATENT DOCUMENTS

| | | | |
|---|---|---|---|
| 5,185,686 | A | 2/1993 | Hansen et al. |
| 5,300,767 | A | 4/1994 | Steinle et al. |
| 5,434,509 | A | 7/1995 | Blades |
| 5,477,150 | A | 12/1995 | Ham, Jr. et al. |
| 5,578,931 | A | 11/1996 | Russell et al. |
| 5,726,577 | A | 3/1998 | Engel et al. |
| 5,729,145 | A | 3/1998 | Blades |
| 6,734,682 | B2 | 5/2004 | Tallman et al. |
| 7,068,045 | B2* | 6/2006 | Zuercher .............. H02H 1/0015 324/512 |
| 7,463,037 | B2 | 12/2008 | Henson et al. |
| 7,489,138 | B2* | 2/2009 | Yu ........................ H02H 1/0015 324/522 |
| 7,580,232 | B2 | 8/2009 | Caggiano et al. |
| 7,750,646 | B2 | 7/2010 | Maity et al. |
| 8,412,966 | B2 | 4/2013 | Tofigh et al. |
| 9,797,941 | B2 | 10/2017 | Kolker et al. |
| 10,078,105 | B2 | 9/2018 | Schneider et al. |
| 2002/0118022 | A1 | 8/2002 | Dring et al. |
| 2002/0130668 | A1* | 9/2002 | Blades .................... G01R 31/11 324/536 |
| 2004/0150410 | A1* | 8/2004 | Schoepf ............... H02H 1/0015 324/536 |
| 2006/0092585 | A1* | 5/2006 | Chan ....................... H02H 1/04 361/42 |
| 2007/0258179 | A1 | 11/2007 | Yoon |
| 2008/0288189 | A1 | 11/2008 | Rao et al. |
| 2011/0299201 | A1 | 12/2011 | Rozman et al. |
| 2012/0089266 | A1* | 4/2012 | Tomimbang ......... H02H 1/0015 700/293 |
| 2014/0198413 | A1 | 7/2014 | Koch |
| 2019/0120889 | A1 | 4/2019 | Carcia |
| 2019/0199080 | A1 | 6/2019 | Schmalz et al. |
| 2019/0386478 | A1 | 12/2019 | Raisigel et al. |
| 2020/0028349 | A1* | 1/2020 | Elliott ................. H02H 1/0015 |
| 2020/0185902 | A1 | 6/2020 | Jakupi et al. |
| 2020/0191856 | A1 | 6/2020 | Peralta et al. |

FOREIGN PATENT DOCUMENTS

| | | |
|---|---|---|
| EP | 2360805 B1 | 8/2011 |
| GB | 2563069 A | 12/2018 |
| WO | 2011017721 A1 | 2/2011 |

OTHER PUBLICATIONS

European Search Report for Application No. 19214757.7, dated May 8, 2020, 7 pages.

* cited by examiner

ARC FAULT DETECTION WITH SENSE WIRE MONITORING

BACKGROUND

The present disclosure relates to aircraft controllers and arc fault detection and, in particular, arc fault detection and protection for solid state power controller circuits and components on an aircraft.

Vehicles, such as aircraft, typically utilize one or more electronic control unit(s) (ECU) and/or Solid State Power Controllers (SSPC), various sensors, and actuators in various control applications to ensure inflight operation, provide for redundancy, and fail-operational capabilities. A primary function performed by an ECU in an aircraft application is engine and flight control, while a primary function of an SSPC is power control and distribution. The electronic control and power distribution systems, are generally interconnected by long distances of wiring routed through cable ways and provided behind various sealed wall and fuselage panels. Wiring in aircraft can be critical to proper operation and regular checks and maintenance are often essential to ensure that wires remain serviceable and in good repair. Damage to the wires can occur due to aging, accidental damage, vibration, chaffing or rubbing against mounts and other wires during flight, bending, getting wet, oily, contaminated, stamped on, or crushed, and the like.

However, over time and due to varied environmental conditions that wires and wire harnesses are subjected to can lead to, the wire insulation becoming more brittle and as a result, arc faults may occur. Arc faults may also be particularly difficult to detect and isolate as many arc faults may be intermittent. Moreover, in some instances, arc faults could lead to arcing, sparks and the like as possible ignition source for combustible materials.

Given the potential risks and concerns associated with arcing, and arc faults, various arc detection systems have therefore been developed. However arc fault detectors have been made for detecting series arcs (i.e., wire connection breaks) and for detecting parallel arcs (connections/shorts to ground). Previous arc fault detectors have been implemented by looking for changes in the load current or trying to correlate noise signals radiated or conducted from a particular load/wire. The accuracy and sensitivity of detection (especially for series arc fault detection), needs improvement, both to detect valid faults and to avoid nuisance detections and fault indications.

SUMMARY

According to one embodiment, disclosed herein is a method of identifying an arc fault in a wire operably connected between a controller and a load. The method includes operably connecting a sense wire to the wire supplied by the controller via the wire, measuring a first voltage on the wire at the load via the sense wire, measuring a second voltage on the wire at an output interface of the controller and measuring a current in the first wire. The method also includes identifying any differences between the voltage on the wire measured at the load and the second voltage on the wire measured at the output interface, ascertaining any anomalies in the current measured in the wire, and correlating the differences between the first voltage and the second voltage with any anomalies in the current to identify an arc fault.

In addition to one or more of the features described above, or as an alternative, further embodiments of the method may include routing the first sense wire in parallel with the first wire.

In addition to one or more of the features described above, or as an alternative, further embodiments of the method may include that the first sense wire is a shield associated with the first wire.

In addition to one or more of the features described above, or as an alternative, further embodiments of the method may include routing the sense first wire with another wire.

In addition to one or more of the features described above, or as an alternative, further embodiments of the method may include the first sense wire is connected to the first wire in close proximity to the first load.

In addition to one or more of the features described above, or as an alternative, further embodiments of the method may include operably connecting a second sense wire to a second wire connected to a second load supplied by the controller via the second wire, measuring a third voltage on the second wire at the load via the second sense wire, measuring a fourth voltage on the second wire at a second output interface of the controller, and measuring a second current in the second wire. The method also further includes identifying any differences between the third voltage on the second wire measured at the load and the fourth voltage on the second wire measured at the second output interface, ascertaining any anomalies in the second current measured in the second wire, and correlating the differences between the third voltage and the fourth voltage with any anomalies in the second current to identify an arc fault.

In addition to one or more of the features described above, or as an alternative, further embodiments of the method may include the first load and the second load are the same.

In addition to one or more of the features described above, or as an alternative, further embodiments of the method may include routing the first sense wire in parallel with the second wire.

In addition to one or more of the features described above, or as an alternative, further embodiments of the method may include routing the second sense wire with the first wire.

In addition to one or more of the features described above, or as an alternative, further embodiments of the method may include that the second sense wire is connected to the second wire in close proximity to the second load.

In addition to one or more of the features described above, or as an alternative, further embodiments of the method may include a third wire and a third sense wire, wherein the load is a three phase load.

In addition to one or more of the features described above, or as an alternative, further embodiments of the method may include that the correlating further includes receiving a signal indicative of the envelope of the spectral content on the wire under test in a selected frequency range, receiving the signal indicative of current in the wire under test based on the measuring, applying a negative clipping function to the signal to form a positive envelope signal, and applying a derivative function to the positive envelope signal, the derivative function yielding a pulse signal indicative of changes in the positive envelope signal. If the pulse signal exceeds a first selected threshold, integrating the pulse signal to yield an accumulated pulse signal; otherwise set the accumulated pulse signal to zero. In addition, if the accumulated pulse signal exceeds a second threshold set a first flag as true indicating a selected amount of information indicative of an arc fault has been acquired. The method also includes counting the occurrences the first flag is set as true, if the count exceeds a selected third threshold, set a second flag indicating the that the spectral content as measured from the wire indicates a possible series arc fault. The method further includes filtering the signal indicative of the current in the wire to formulate a pulse associated with when the measured current exhibits an interruption, and accumulating instances when the measured current exhibits an interruption based on the pulses. If the accumulated instances when the measured current exhibits an interruption exceeds a fourth selected threshold a second flag indicating the that the spectral contend as measured from the wire indicates a possible series arc faults is set, then identify a series arc fault in the wire.

In addition to one or more of the features described above, or as an alternative, further embodiments of the method may include the controller being further operable to execute a method of identifying an arc fault in a wire further comprising, if the accumulated pulse signal exceeds a fifth selected threshold and the count exceeds a selected sixth selected threshold, set a third flag indicating the that the spectral content as measured from the wire indicates a possible parallel arc fault, filtering the signal indicative of the current in the wire to formulate pulses associated with when the measured current exhibits an interruption. If the pulses exceed a seventh selected threshold, accumulating instances when the measured current exhibits an interruption based on the pulses, if the accumulated instances when the measured current exhibits an interruption exceeds an eighth selected threshold setting a fourth flag indicative of a current fault, if the third flag indicating the that the spectral content as measured from the wire indicates a possible parallel arc fault is set and the fourth flag indicating a sufficient current fault is set, identify a parallel arc fault for the wire.

In addition to one or more of the features described above, or as an alternative, further embodiments of the method may include that the receiving a signal indicative of the envelope of the spectral content on the wire under test in a selected frequency range is based on filtering the first voltage on the first wire with a bandpass filter having a selected pass band to select and retain spectral content, wherein the pass band frequency range in the range of about 10 MHz to about 40 MHz, amplifying the retained spectral content with a linear preamplifier, and identifying an envelope of the amplifier retained spectral content by applying a logarithmic amplifier to the amplified retained spectral content, the envelope indicative of the RF energy content of the spectral content in the pass band. The controller incudes a current sense function, the current sense function including measuring a first current in the first wire, The method also includes correlating changes in the first current with a characteristic of the amplified retained spectral content to identify an arc fault, wherein the characteristic includes a buffered envelope as a signal indicative of the amount of energy in the selected pass band frequency range.

Also described herein in another embodiment is system for identifying an arc fault in a wire. The system includes a controller operably connected to a first load via first wire; the controller configured to supply a current to the first load via the first wire, a first sense wire operably connected to the first wire, the first sense wire operably connected to the controller. The controller includes a voltage sense function and a current sensing function, the controller operable to execute a process to measure a first voltage on the first wire at the first load via the first sense wire, measure a second voltage on the first wire at a first output interface of the controller, and measure a first current in the first wire. The controller is also configured to identify any differences between the first voltage on the first wire measured at the first load and the second voltage on the first wire measure at the first output interface, ascertain any anomalies in the first current measured in the first wire, and correlate the differences between the first voltage and the second with any anomalies in the current to identify an arc fault.

In addition to one or more of the features described above, or as an alternative, further embodiments of the system may include that the first sense wire is routed in parallel with the first wire.

In addition to one or more of the features described above, or as an alternative, further embodiments of the system may include that the first sense wire is a shield associated with the first wire.

In addition to one or more of the features described above, or as an alternative, further embodiments of the system may include that the first sense wire is routed with another wire.

In addition to one or more of the features described above, or as an alternative, further embodiments of the system may include that the first sense wire is connected to the first wire in close proximity to the first load.

In addition to one or more of the features described above, or as an alternative, further embodiments of the system may include a second sense wire operably connected to a second wire operably connected to a second load, the second wire supplied by the controller, the second sense wire in operable communication with the controller. The controller is also operable to execute a method to measure a third voltage on the second wire at the load via the second sense wire, measure a fourth voltage on the second wire at a second output interface of the controller, and measure a second current in the second wire. The controller is also operable to execute a method to identify any differences between the third voltage on the second wire measured at the load and the fourth voltage on the second wire measured at the second output interface, ascertain any anomalies in the second current measured in the second wire, and correlate the differences between the third voltage and the fourth voltage with any anomalies in the second current to identify an arc fault.

In addition to one or more of the features described above, or as an alternative, further embodiments of the system may include that the first load and the second load are the same.

In addition to one or more of the features described above, or as an alternative, further embodiments of the system may include routing the first sense wire in parallel with the second wire.

In addition to one or more of the features described above, or as an alternative, further embodiments of the system may include routing the second sense wire with the first wire.

In addition to one or more of the features described above, or as an alternative, further embodiments of the system may include that the second sense wire is connected in close proximity to the second load.

In addition to one or more of the features described above, or as an alternative, further embodiments of the method may include a third wire and a third sense wire, wherein the load is a three phase load.

In addition to one or more of the features described above, or as an alternative, further embodiments of the method may include that the correlating the differences between the first voltage and the second with any anomalies in the current to identify an arc fault in a wire further includes receiving a signal indicative of the envelope of the spectral content on the wire in a selected frequency range, receiving a signal indicative of current in the wire, applying a negative clipping function to the signal to form a positive envelope signal, and applying a derivative function to the positive envelope signal, the derivative function yielding a pulse signal indicative of changes in the positive envelope signal. The correlating the difference between the first voltage and the second also includes that if the pulse signal exceeds a first selected threshold, integrating the pulse signal to yield an accumulated pulse signal; otherwise set the accumulated pulse signal to zero, if the accumulated pulse signal exceeds a second threshold set a first flag as true indicating a selected amount of information indicative of an arc fault has been acquired, counting the occurrences when the first flag is set as true, and if the count exceeds a selected third threshold, set a second flag indicating the that the spectral content as measured from the wire indicates a possible series arc fault. The correlating the difference between the first voltage and the second also includes filtering the signal indicative of the current in the wire to formulate a pulse associated with when the measured current exhibits an interruption, accumulating instances when the measured current exhibits an interruption based on the pulses, and if the accumulated instances when the measured current exhibits an interruption exceeds a fourth selected threshold and the a second flag indicating the that the spectral contend as measured from the wire indicates a possible series arc faults is set, then identify a series arc fault in the wire.

In addition to one or more of the features described above, or as an alternative, further embodiments of the method may include the controller further operable to execute a method of identifying an arc fault in a wire further including that if the accumulated pulse signal exceeds a fifth selected threshold and the count exceeds a selected sixth selected threshold, set a third flag indicating the that the spectral content as measured from the wire indicates a possible parallel arc fault, filtering the signal indicative of the current in the wire to formulate a pulse associated with when the measured current exhibits an interruption, if the pulses exceed a seventh selected threshold, accumulating instances when the measured current exhibits an interruption based on the pulses, if the accumulated instances when the measured current exhibits an interruption exceeds an eighth selected threshold setting a fourth flag indicative of a current fault, and if the third flag indicating the that the spectral content as measured from the wire indicates a possible parallel arc fault is set and the fourth flag indicating a sufficient current fault is set, identify a parallel arc fault for the wire.

In addition to one or more of the features described above, or as an alternative, further embodiments of the method may include the controller receiving a signal indicative of the envelope of the spectral content on the wire in a selected frequency range further includes a voltage sense function configured to measure a voltage on the first wire, the controller operable to filter the first voltage on the first wire with a bandpass filter having a selected pass band frequency range to select and retain spectral content, amplify the retained spectral content with a linear preamplifier, identify an envelope of the amplified retained spectral content by applying a logarithmic amplifier to the amplified retained spectral content, the envelope indicative of the RF energy content of the spectral content in the pass band of the voltage on the first wire, a current sense function, the current sense function operable to measure a first current in the first wire, and correlating changes in the first current with a characteristic of the amplified retained spectral content to identify an arc fault, wherein the characteristic includes a buffered envelope as a signal indicative of the amount of energy in the selected passband frequency range.

Also described herein in yet another embodiment is a system for identifying an arc fault in a wire, the system comprising a controller operably connected to a first load via first wire; the controller configured to supply a current to the first load via the first wire, wherein the controller includes a voltage sense function configured to measure a voltage on the first wire, the controller operable to filter the first voltage on the first wire with a bandpass filter having a selected pass band frequency range to select and retain spectral content, amplify the retained spectral content with a linear preamplifier, and identify an envelope of the amplified retained spectral content by applying a logarithmic amplifier to the amplified retained spectral content, the envelope indicative of the RF energy content of the spectral content in the pass band of the voltage on the first wire. The controller also includes a current sense function, the current sense function operable to measure a first current in the first wire, correlating changes in the first current with a characteristic of the amplified retained spectral content to identify an arc fault, wherein the characteristic includes a buffered envelope as a signal indicative of the amount of energy in the selected passband frequency range.

In addition to one or more of the features described above, or as an alternative, further embodiments of the system may include the controller operable to execute a method of identifying an arc fault in a wire comprising, receiving a signal indicative of the envelope of the spectral content on the wire in a selected frequency range, receiving a signal indicative of current in the wire, applying a negative clipping function to the signal to form a positive envelope signal and applying a derivative function to the positive envelope signal, the derivative function yielding a pulse signal indicative of changes in the positive envelope signal. If the pulse signal exceeds a first selected threshold, integrating the pulse signal to yield an accumulated pulse signal; otherwise set the accumulated pulse signal to zero, and if the accumulated pulse signal exceeds a second threshold set a first flag as true. The system further includes the controller executing a method also including counting the occurrences when the first flag is set as true, if the count exceeds a selected third threshold, set a second flag, filtering the signal indicative of the current in the wire to formulate a pulse associated with when the measured current exhibits an interruption, and accumulating instances when the measured current exhibits an interruption based on the pulses. If the accumulated instances when the measured current exhibits an interruption exceeds a fourth selected threshold and a second flag indicating the that the spectral contend as measured from the wire indicates a possible series arc faults is set, then identify a series arc fault in the wire.

In addition to one or more of the features described above, or as an alternative, further embodiments of the system may include the controller further operable to execute a method of identifying an arc fault in a wire further including that if the accumulated pulse signal exceeds a fifth selected threshold and the count exceeds a selected sixth selected threshold, set a third flag, filtering the signal indicative of the current in the wire to formulate a pulse associated with when the measured current exhibits an interruption, and if the pulses exceed a seventh selected threshold, accumulating instances when the measured current exhibits an interruption based on the pulses. The method further includes if the accumulated instances when the measured current exhibits an interruption exceeds an eighth selected threshold setting a fourth flag indicative of a current fault, and if the third flag indicating the that the spectral content as measured from the wire indicates a possible parallel arc fault is set and the fourth flag indicating a sufficient current fault is set, identify a parallel arc fault for the wire.

In addition to one or more of the features described above, or as an alternative, further embodiments of the system may include at least one of the first selected threshold, the second selected threshold, the third selected threshold, the fourth selected threshold, the fifth selected threshold, the sixth selected threshold, and the seventh selected threshold is based on empirical determination from test data and selected to improve the detection and reduce nuisance trips.

In addition to one or more of the features described above, or as an alternative, further embodiments of the method may include that the pass band is in the range of at least one of: about 10 MHz to about 40 MHz; about 10 MHz to about 80 MHz; and about 10 MHz to about 150 MHz.

In addition to one or more of the features described above, or as an alternative, further embodiments of the method may include that the negative clipping function clipping function captures only increases in RF energy and avoid reductions to the envelope signal when no noise is detected.

In addition to one or more of the features described above, or as an alternative, further embodiments of the method may include that setting the first flag as true indicates a selected amount of information indicative of an arc fault has been acquired.

In addition to one or more of the features described above, or as an alternative, further embodiments of the method may include that setting the second flag as true indicates that the spectral content as measured from the wire indicates a possible series arc fault.

In addition to one or more of the features described above, or as an alternative, further embodiments of the method may include that setting the third flag as true indicates the that the spectral content as measured from the wire indicates a possible parallel arc fault.

Also described herein in yet another embodiment is a method for identifying an arc characteristic in a wire operably connected between a controller and a first load where the controller is configured to supply a current to the first load via the first wire and measure a voltage on the first wire, the controller configured to execute a method, the method including filtering the first voltage on the first wire with a bandpass filter having a selected pass band to select and retain spectral content, wherein the pass band frequency range in the range of about 10 MHz to about 40 MHz, amplifying the retained spectral content with a linear pre-amplifier, and identifying an envelope of the amplified retained spectral content by applying a logarithmic amplifier to the amplified retained spectral content, the envelope indicative of the RF energy content of the spectral content in the pass band. The method also includes a current sense function, the current sense function including measuring a first current in the first wire, and correlating changes in the first current with a characteristic of the amplified retained spectral content to identify an arc fault, wherein the characteristic includes a buffered envelope as a signal indicative of the amount of energy in the selected pass band frequency range.

In addition to one or more of the features described above, or as an alternative, further embodiments of the method may include the controller operable to execute a method of identifying an arc fault in a wire including receiving a signal indicative of the envelope of the spectral content on the wire in a selected frequency range, receiving a signal indicative of current in the wire, applying a negative clipping function to the signal to form a positive envelope signal, and applying a derivative function to the positive envelope signal, the derivative function yielding a pulse signal indicative of changes in the positive envelope signal. If the pulse signal exceeds a first selected threshold, integrating the pulse signal to yield an accumulated pulse signal; otherwise set the accumulated pulse signal to zero, if the accumulated pulse signal exceeds a second threshold set a first flag as true. In addition, the method also includes counting the occurrences when the first flag is set as true, if the count exceeds a selected third threshold, set a second flag as true, filtering the signal indicative of the current in the wire to formulate a pulse associated with when the measured current exhibits an interruption, accumulating instances when the measured current exhibits an interruption based on the pulses, and if the accumulated instances when the measured current exhibits an interruption exceeds a fourth selected threshold and the a second flag indicating the that the spectral contend as measured from the wire indicates a possible series arc faults is set, then identify a series arc fault in the wire.

In addition to one or more of the features described above, or as an alternative, further embodiments of the method may include the controller further operable to execute a method of identifying an arc fault in a wire further including that if the accumulated pulse signal exceeds a fifth selected threshold and the count exceeds a selected sixth selected threshold, set a third flag, filtering the signal indicative of the current in the wire to formulate a pulse associated with when the measured current exhibits an interruption, if the pulses exceed a seventh selected threshold, accumulating instances when the measured current exhibits an interruption based on the pulses, if the accumulated instances when the measured current exhibits an interruption exceeds an eighth selected threshold setting a fourth flag indicative of a current fault, if the third flag indicating the that the spectral content as measured from the wire indicates a possible parallel arc fault is set and the fourth flag indicating a sufficient current fault is set, identify a parallel arc fault for the wire.

In addition to one or more of the features described above, or as an alternative, further embodiments of the method may include that at least one of the first selected threshold, the second selected threshold, the third selected threshold, the fourth selected threshold, the fifth selected threshold, the sixth selected threshold, and the seventh selected threshold is based on empirical determination from test data and selected to improve the detection and reduce nuisance trips.

In addition to one or more of the features described above, or as an alternative, further embodiments of the method may include that the pass band is in the range of at least one of: about 10 MHz to about 40 MHz; about 10 MHz to about 80 MHz; and about 10 MHz to about 150 MHz.

In addition to one or more of the features described above, or as an alternative, further embodiments of the method may include that the negative clipping function clipping function captures only increases in RF energy and avoid reductions to the envelope signal when no noise is detected.

In addition to one or more of the features described above, or as an alternative, further embodiments of the method may include that setting the first flag as true indicates a selected amount of information indicative of an arc fault has been acquired.

In addition to one or more of the features described above, or as an alternative, further embodiments of the method may include that setting the second flag as true indicates that the spectral content as measured from the wire indicates a possible series arc fault.

In addition to one or more of the features described above, or as an alternative, further embodiments of the method may include that setting the third flag as true indicates the that the spectral content as measured from the wire indicates a possible parallel arc fault.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description.

BRIEF DESCRIPTION OF THE DRAWINGS

The subject matter which is regarded as the disclosure is particularly pointed out and distinctly claimed in the claims at the conclusion of the specification. The foregoing and other features, and advantages of the disclosure are apparent from the following detailed description taken in conjunction with the accompanying drawings in which:

DETAILED DESCRIPTION

Figure 1:
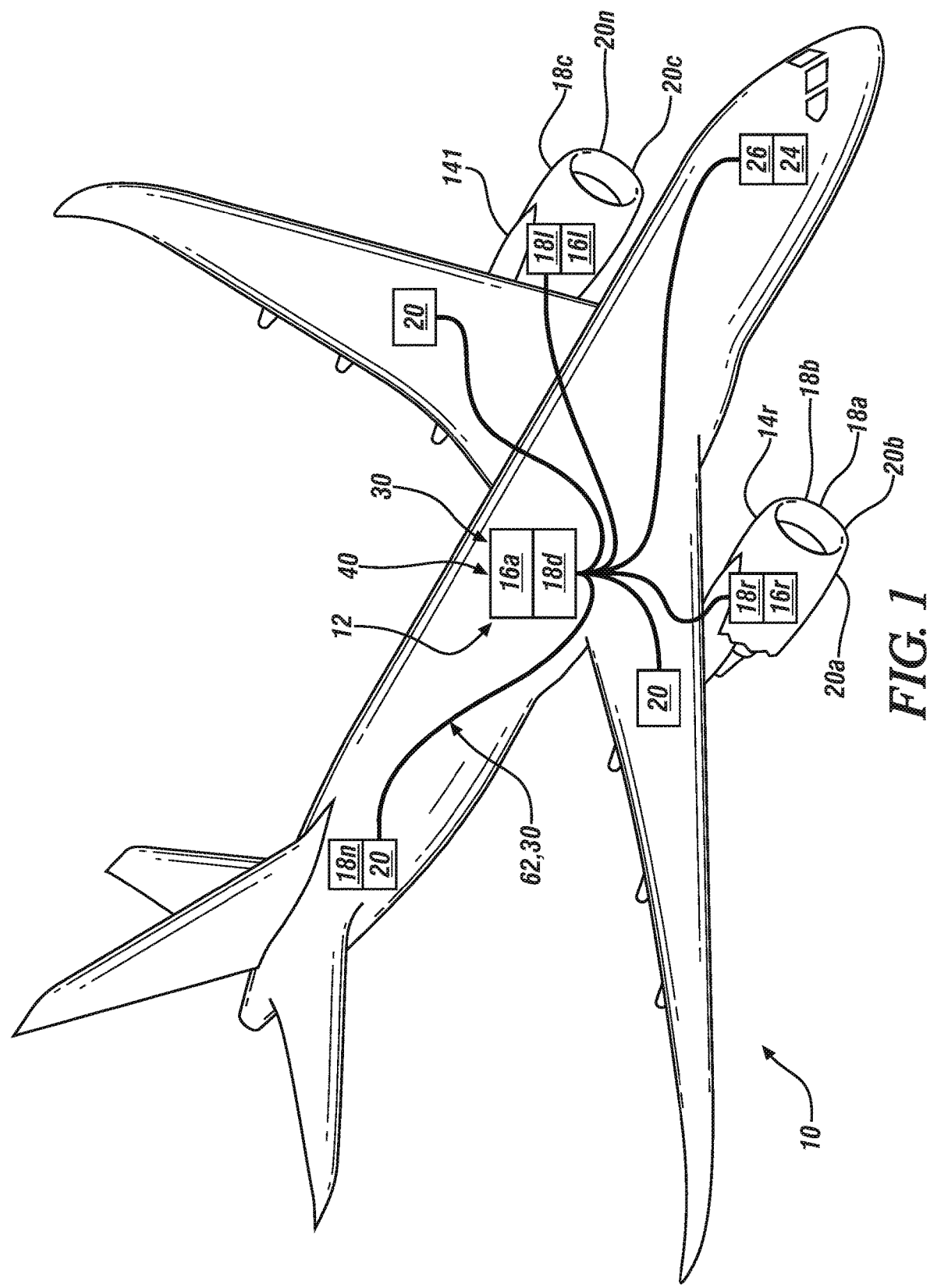
FIG. 1 depicts a simplified diagram of an aircraft with an electrical system including various controllers and aircraft wiring in accordance with an embodiment.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended. The following description is merely illustrative in nature and is not intended to limit the present disclosure, its application or uses. It should be understood that throughout the drawings, corresponding reference numerals indicate like or corresponding parts and features. As used herein, the term controller refers to processing circuitry that may include an application specific integrated circuit (ASIC), an electronic circuit, an electronic processor (shared, dedicated, or group) and memory that executes one or more software or firmware programs, a combinational logic circuit, and/or other suitable interfaces and components that provide the described functionality.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

In general, embodiments herein relate to an application of a method and system to identify series and parallel arc faults. Series and parallel arc faults generate a voltage across them that can be distinguished. The existence of an arc voltage is measured and used to validate the occurrence of an arc fault event. To facilitate this measurement, in an embodiment, a sense wire/connection independent of the wire carrying power to the load measures the arc voltage. The sense wire is routed out from the SSPC to the load in various ways but always referenced back to the output of the SSPC. The sense wire can be a separate wire running parallel to the wire under test, a separate wire running on a separate wire bundle and/or the shield of the wire under test, and the like. In an SSPC application, a load sense wire is monitored for arc events by measuring the voltage drop across it. A difference of potential can be measured from the point the wire reaches the load and referenced back to the output of the SSPC driving the load.

Advantageously, the described embodiments provide a clear indication through arc voltage detection and looking for current variations as to when a series arc fault or parallel arc fault is occurring. By routing the sense wire along an alternate path as indicated in this invention, additional protection of the fault detection is provided.

Referring to FIG. 1, an aircraft 10 is shown. Aircraft 10 includes one or more control systems shown generally as 12. The control system 12 includes and interconnects with one or more controllers referred to generally as 16 and more specifically as 16*l*, 16*r* commonly located at or near each engine 14*l*, 14*r*. Other controllers 16 such a Solid State Power Controller (SSPC) 16 are also be depicted in this instance as 16*a*, 16*b*, and the like.

In the described embodiments, the reference numerals are annotated with an "l" or "r" to denote the left or right side of the aircraft 10 for the purpose of simplicity of description. Likewise, the annotation "a", "b", " . . . n" is employed to simplify designation of a multiple enumeration of a component or element.

Each of the controllers 16 including engine controllers 16*r*, 16*l* and SSPC 16*a*, 16*b* are configured to receive various sensor signals from sensors referred to generally as 18 and individually as 18*a*, 18*b*, . . . 18*n* all over the aircraft 10 and may also operate one or more actuators shown generally as 20, and more specifically as 20*a*, 20*b*, 20*c*, . . . 20*n* to control the operation of the engines 14*r*, 14*l*, flight controls, (not shown), power systems, (not shown), and the like. The control system 12 may also be operably connected to various other components throughout the aircraft 10, including, but not limited to other controllers 16, control panels 24, displays 26, and the like.

With reference to FIGS. 2A-2E, each depicting a partial block diagram of a portion of an SSPC controller 16 in accordance with one or more embodiments.

Figure 2A:
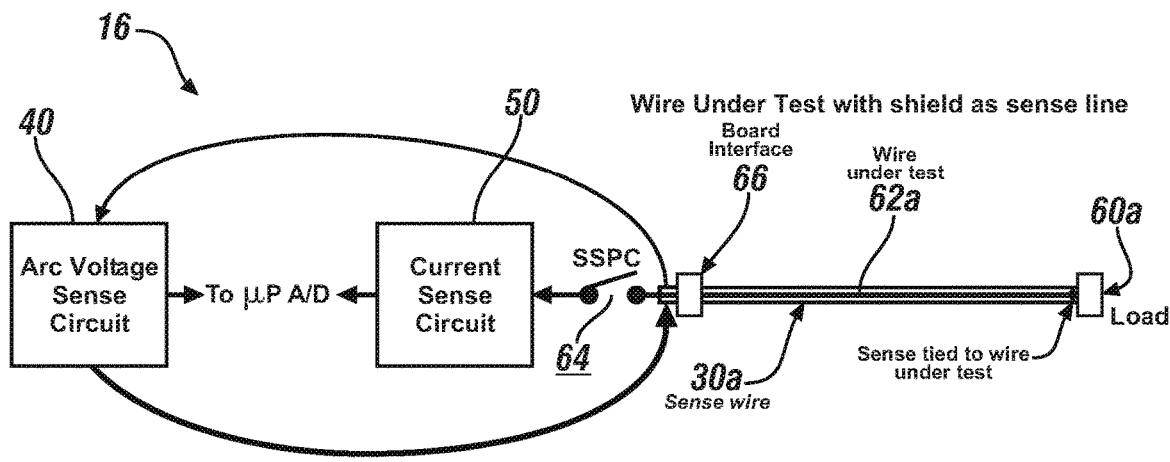
FIG. 2A depicts a partial diagram of a SSPC system depicting a portion of a controller interfaced with a load including sense wires in accordance with an embodiment.

FIG. 2A depicts a portion of the SSPC 16 with an arc voltage sense circuit 40, current sense circuit 50 and a sense wire 30*a* operably connected thereto in accordance with an embodiment. In an embodiment, arc fault detection for the one or more controller(s) 16 is provided by various sense wires shown generally as 30, and more specifically as 30*a*, 30*b*, 30*n* and independent arc voltage sense circuits 40 in the SSPC controller(s) e.g. 16 and current sense circuits denoted as 50 respectively, each integral with and connected to respective controllers 16. In operation of an SSPC 16, a given load denoted as 60*a* in this instance, is supplied with a power or a command signal on a selected wire 62*a*, also denoted as wire under test. The SSPC 16 may include a switch or switching function as depicted by switch 64 that controls the application of the power or a command to the wire under test 62*a*, which is connected to the load 60*a*. The sense wire, in this instance sense wire 30*a* is operably connected to the wire under test 62*a* in close proximity to the load 60*a*. The sense wire 30*a* is also operably connected to the arc sense circuit 40. In this embodiment, the sense wire 30*a* may be a shield on the wire under test 62*a*.

Figure 2B:
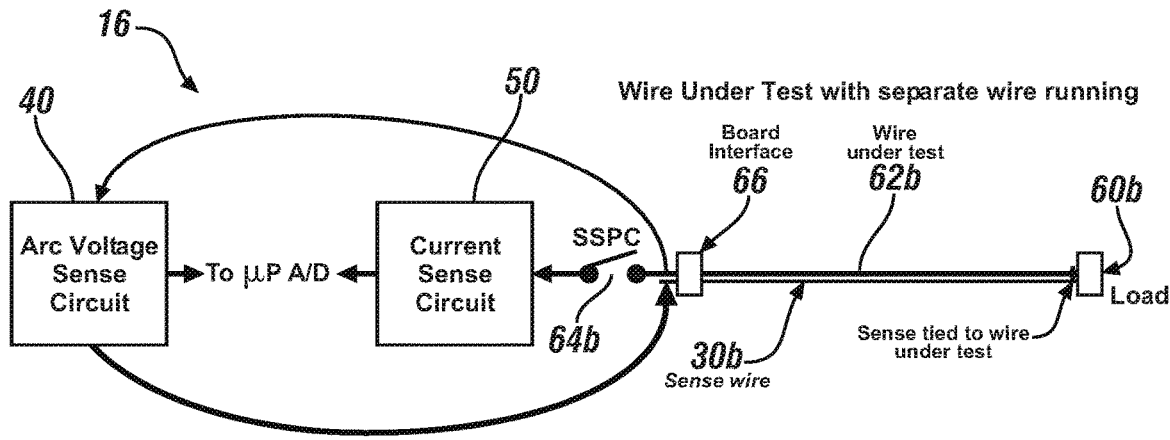
FIG. 2B depicts a partial diagram of a SSPC system depicting a portion of a controller interfaced with a load including sense wires in accordance with an embodiment.

In another embodiment, as depicted in FIG. 2B, the sense wire 30*b* may be a separate wire, routed essentially in parallel with the wire under test 62*a*.

In an embodiment, while switch 64*b* is closed and the power or command is provided to the load 60*a*, the arc sense circuit 40 monitors the voltage at the board interface output 66 of the SSPC 16 at the wire under test 62*a*. The arc sense circuit 40 also monitors the voltage on the wire under test 62*a* at the load 60*a* via the sense wire 30*a*. The arc sense circuit 40 compares these two voltages and any difference in voltage noted is identified as a potential arc fault. In addition, the SSPC 16 also includes a current sense circuit 50 for monitoring of the current supplied by the SSPC 16 to the load 60. In an embodiment, the SSPC 16 monitors the current supplied to the load 60 as well. Current transients may be indicative of a fault. For example, increasing current transients may be indicative of a short circuit to ground or a short circuit to another circuit, while large decreasing current transients are indicative of breaks in the wire under test 62*a*. By correlating the measured arc voltage measured differentials with the variations in the current to the load 60*a*, a more robust detection of arc faults is provided.

Figure 2C:
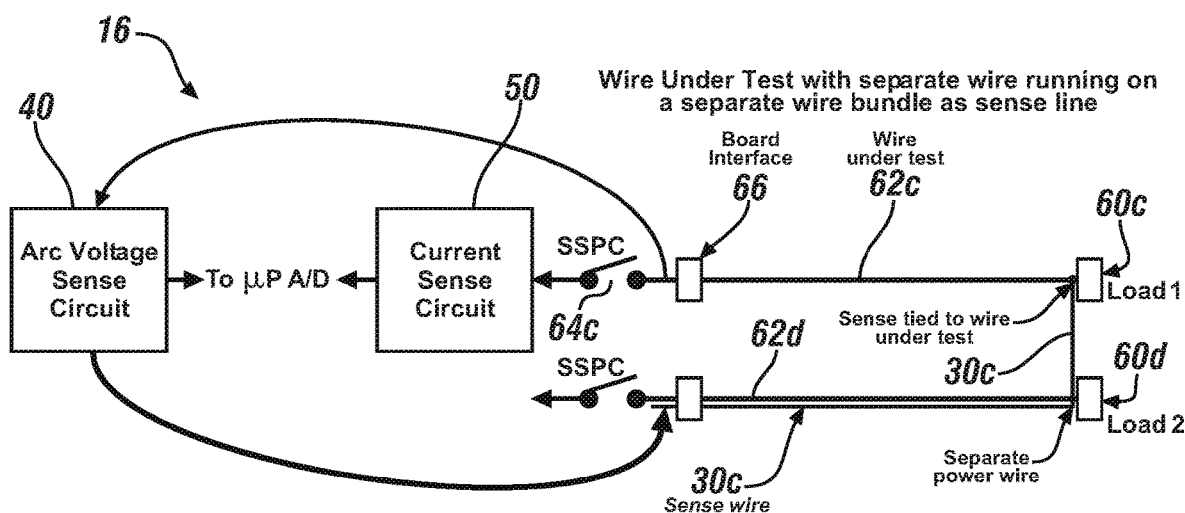
FIG. 2C depicts a partial diagram of a SSPC system depicting a portion of a controller interfaced with a load including sense wires in accordance with an embodiment.

FIG. 2C depicts embodiment of a portion of the SSPC 16 with arc voltage sense circuit 40, current sense circuit 50 and a sense wires 30*c* in accordance with another embodiment. Once again, in operation, of an SSPC 16, a load 60*c* is supplied with a power or a command signal on a selected wire, (e.g., wire under test) 62*c* in this instance. In this embodiment, second load 60*d* is also supplied with a power or a command signal on a selected wire denoted 62*d*, in this instance. That is, another power wire (and possibly a wire under test for another arc voltage sense circuit 40). The SSPC 16, once again, may include switch or switching function 64*c*, that controls the application of the power or a command to the wire under test 62*c* connected to the load 60*c*. The sense wire, in this instance sense wire 30*c* is operably connected to the wire under test 62*c* in close proximity to the load 60*c* and to the arc sense circuit 40 as described herein. In this embodiment, the sense wire 30*c* is routed in close proximity to second power wire 62*d*. In this manner, any fault likely to occur in the wire under test 62*c* is unlikely to also affect the sense wire 30*c* as it is routed in a harness with wire 62*d*.

In this embodiment, once again while switch 64*c* is closed and the power or command is provided to the load 60*c*, the arc sense circuit 40 monitors the voltage at the board interface output 66 of the SSPC 16 and on the wire under test 62*c* at the load 60*c* via the sense wire 30*c*. The arc sense circuit 40 compares these two voltages and any difference in voltage noted is identified as a potential arc fault as described herein. In addition, the current sense circuit 50 monitors the current supplied by the SSPC 16 to the load 60 for current transients as described herein. Once again, by correlating the measured arc voltage measured differentials with the variations in the current to the load 60*c*, a more robust detection of arc faults is provided.

Figure 2D:
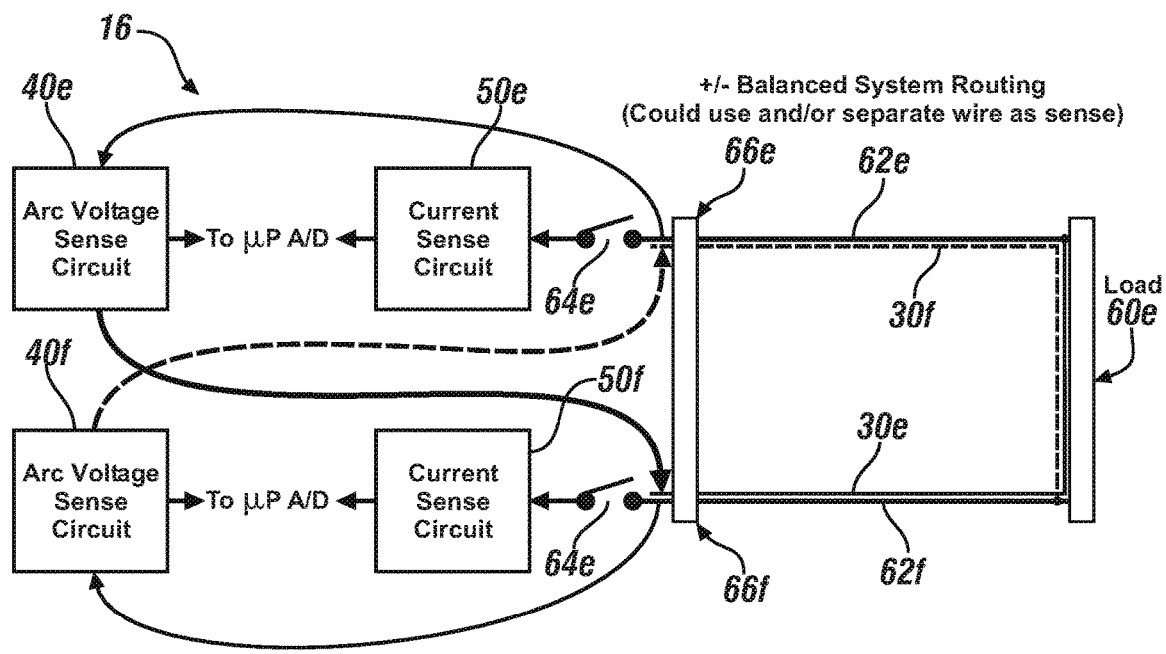
FIG. 2D depicts a partial diagram of a SSPC system depicting a portion of a controller interfaced with a load including sense wires in accordance with an embodiment.

FIG. 2D depicts another embodiment of a portion of the SSPC 16 for detecting arc faults. In this embodiment, the SSPC 16 includes arc voltage sense circuit(s) 40*e* and 40*f*, current sense circuit(s) 50*e* and 50*f*, and sense wire(s) 30*e* and 30*f* in accordance with another embodiment for a balanced load 60*e*. In this embodiment, in operation, of an SSPC 16, the load 60*e* is supplied with a power or a command signal on a selected wire, (e.g., wire under test) 62*e* and a second wire 62*f*. That is, another power wire (and a second wire under test 62*f* for another arc voltage sense circuit denoted 40*f*). The SSPC 16, once again, may include switch or switching function(s) 64*e*, and 64*f* that control the application of the power or a command to the wire under test 62*e*, and/or 62*f* respectively. A first sense wire, in this instance sense wire 30*e* is operably connected to the wire under test 62*e* in close proximity to the load 60*e* and to the arc sense circuit 40*e* as described herein. In this embodiment, the sense wire 30*e* is routed in close proximity to second power wire 62*f*. In this manner, any fault likely to occur in the wire under test 62*e* is unlikely to also affect the sense wire 30*e* as it is routed in a harness with wire 62*f*. Similarly, a second sense wire, in this instance sense wire 30*f* is operably connected to the wire under test 62*e* in close proximity to the load 60*e* and to the arc sense circuit 40*f* as described herein. In this embodiment, the sense wire 30*f* is routed in close proximity to first power wire i.e., wire under test 62*e*. In this manner, any fault likely to occur in the wire under test 62*f* is unlikely to also affect the sense wire 30*f* as it is routed in a harness with wire 62*e*.

In this embodiment, once again while switch 64*e* is closed and the power or command is provided to the load 60*e*, the arc sense circuit 40*e* monitors the voltage at the board interface output 66*e* of the SSPC 16 at the wire under test 62*e*. The arc sense circuit 40*e* also monitors the voltage on the wire under test 62*e* at the load 60*e* via the sense wire 30*e*. The arc sense circuit 40 compares these two voltages and any difference in voltage noted is identified as a potential arc fault as described herein. In addition, the current sense circuit 50*e* monitors the current supplied by the SSPC 16 to the load 60*e* for current transients as described herein. Once again, by correlating the measured arc voltage measured differentials with the variations in the current to the load 60*e*, a more robust detection of arc faults is provided. Likewise, for the other half of the circuit, while switch 64*f* is closed and the power or command is provided to the load 60*e* via wire 64*f*, the arc sense circuit 40*f* monitors the voltage at the board interface output 66*f* of the SSPC 16 at the wire under test 62*f*. The arc sense circuit 40*f* also monitors the voltage on the wire under test 62*f* at the load 60*e* via the sense wire 30*f*. The arc sense circuit 40*f* compares these two voltages and any difference in voltage noted is identified as a potential arc fault as described herein. In addition, the current sense circuit 50*f* monitors the current supplied by the SSPC 16 to the load 60*e* for current transients as described herein. Once again, by correlating the measured arc voltage measured differentials with the variations in the current to the load 60*e*, a more robust detection of arc faults is provided.

Figure 2E:
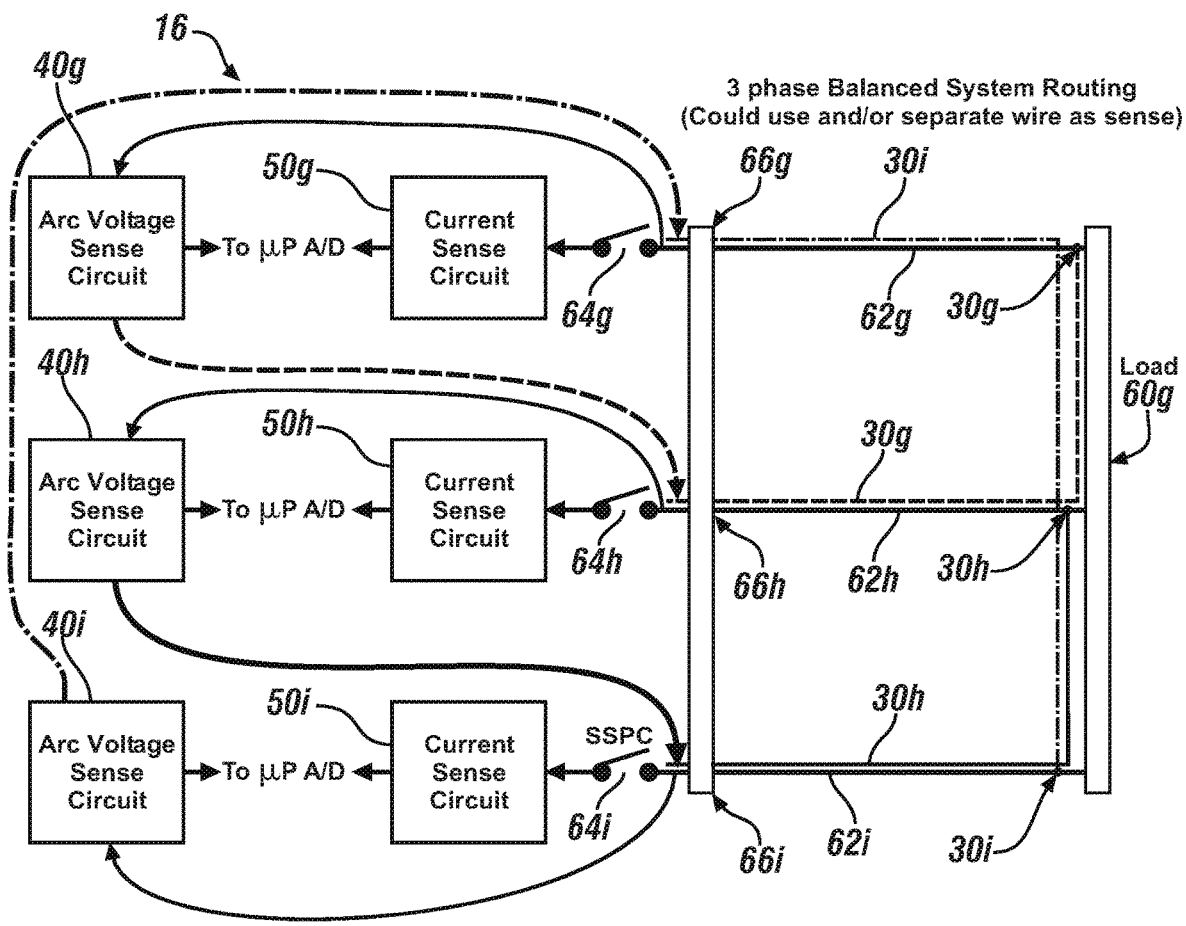
FIG. 2E depicts a partial diagram of a SSPC system depicting a portion of a controller interfaced with a load including sense wires in accordance with an embodiment.

FIG. 2E depicts another embodiment of a portion of the SSPC 16 for detecting arc faults for a three phase load. In this embodiment, the SSPC 16 includes arc voltage sense circuit(s) 40g 40h and 40i, current sense circuit(s) 50g, 50h, and 50i, and sense wire(s) 30g, 30h, and 30i in accordance with another embodiment for a three phase load denoted 60g. In this embodiment, in operation, of an SSPC 16, the load 60g is supplied with a power or a command signal on a selected wire, (e.g., wire under test) 62g, a second wire 62h, and a third wire 62i. That is, three wire(s) under test denoted 62g, 62h, and 62i respectively for another arc voltage sense circuit denoted 40g, 40h, and 40i respectively. The SSPC 16, once again, may include switch or switching function(s) 64g, 64h, and 64i that each respectively control the application of the power or a command to the wire(s) under test 62g, 62h, and/or 62i respectively.

A first sense wire, in this instance sense wire 30g is operably connected to the wire under test 62g in close proximity to the load 60e and to the arc sense circuit 40g as described herein. In this embodiment, the sense wire 30g is routed in close proximity to a second power wire 62h as described in the other embodiments herein. In this manner, any fault likely to occur in the wire under test 62g is unlikely to also affect the sense wire 30g as it is routed in a harness with wire 62h. Similarly, a second sense wire, in this instance sense wire 30h is operably connected to the wire under test 62h in close proximity to the load 60e and to the arc sense circuit 40h as described herein. In this embodiment, the sense wire 30f is routed in close proximity to a third power wire, i.e., wire under test 62i. In this manner, any fault likely to occur in the wire under test 62h is unlikely to also affect the sense wire 30h as it is routed in a harness with wire 62i.

Furthermore, in this embodiment, a third sense wire, in this instance sense wire 30i is operably connected to the wire under test 62i in close proximity to the load 60e and to the arc sense circuit 40i as described herein. In this embodiment, the sense wire 30i is routed in close proximity to the first power wire, i.e., wire under test 62g. In this manner, any fault likely to occur in the wire under test 62i is unlikely to also affect the sense wire 30i as it is routed in a harness with wire 62g. It should be appreciated that the sense wires could be the shields or separates sense wires associated with the wires under test 62g, 62h, 62i routed with the wires under test 62g, 62h, 62i. In addition, it should also be appreciated that the sense wires 30g, 30h, 30i could also be routed the another of the threes wires under test 62g, 62h, and 62i. For example, instead of the sense wire 30g being routed with wire under test 62h as described herein, it could instead be routed with wire under test 62i. Likewise for the sense wires 62h and 62i each could be routed with a different wire under test than identified above.

In this embodiment, once again while the switch 64g is closed and the power or command is provided to the load 60e, the arc sense circuit 40g monitors the voltage at the board interface output 66g of the SSPC 16 at the wire under test 62g. The arc sense circuit 40g also monitors the voltage on the wire under test 62g at the load 60g via the sense wire 30g. The arc sense circuit 40g compares these two voltages and any difference in voltage noted is identified as a potential arc fault as described herein. In addition, the current sense circuit 50g monitors the current supplied by the SSPC 16 to the load 60g for current transients as described herein. Once again, by correlating the measured arc voltage measured differentials with the variations in the current to the load 60g, a more robust detection of arc faults is provided. Likewise, for the second part of the circuit, while switch 64h is closed and the power or command is provided to the load 60e via wire 62h, the arc sense circuit 40h monitors the voltage at the controller 16 board interface output 66h of the SSPC 16 at the wire under test 62h. The arc sense circuit 40h also monitors the voltage on the wire under test 62h at the load 60g via the sense wire 30h. The arc sense circuit 40h compares these two voltages and any difference in voltage noted is identified as a potential arc fault as described herein. In addition, the current sense circuit 50h monitors the current supplied by the SSPC 16 to the load 60g for current transients as described herein. Once again, by correlating the measured arc voltage measured differentials with the variations in the current to the load 60g, a more robust detection of arc faults is provided. Finally, for the third part of the circuit, while switch 64i is closed and the power or command is provided to the load 60e via wire 62i, the arc sense circuit 40i monitors the voltage at the board interface output 66i of the SSPC 16 at the wire under test 62i. The arc sense circuit 40h also monitors the voltage on the wire under test 62i at the load 60g via the sense wire 30i. The arc sense circuit 40i compares these two voltages and any difference in voltage noted is identified as a potential arc fault as described herein. In addition, the current sense circuit 50i monitors the current supplied by the SSPC 16 to the load 60g for current transients as described herein. Once again, by correlating the measured arc voltage measured differentials with the variations in the current to the load 60g, a more robust detection of arc faults is provided. It should be appreciated that in a standard three-phase power application, switches 64g, 64h, and 64i would, as a matter of practice and implementation be opened or closed simultaneously, though it need not necessarily be the case.

Figure 3:
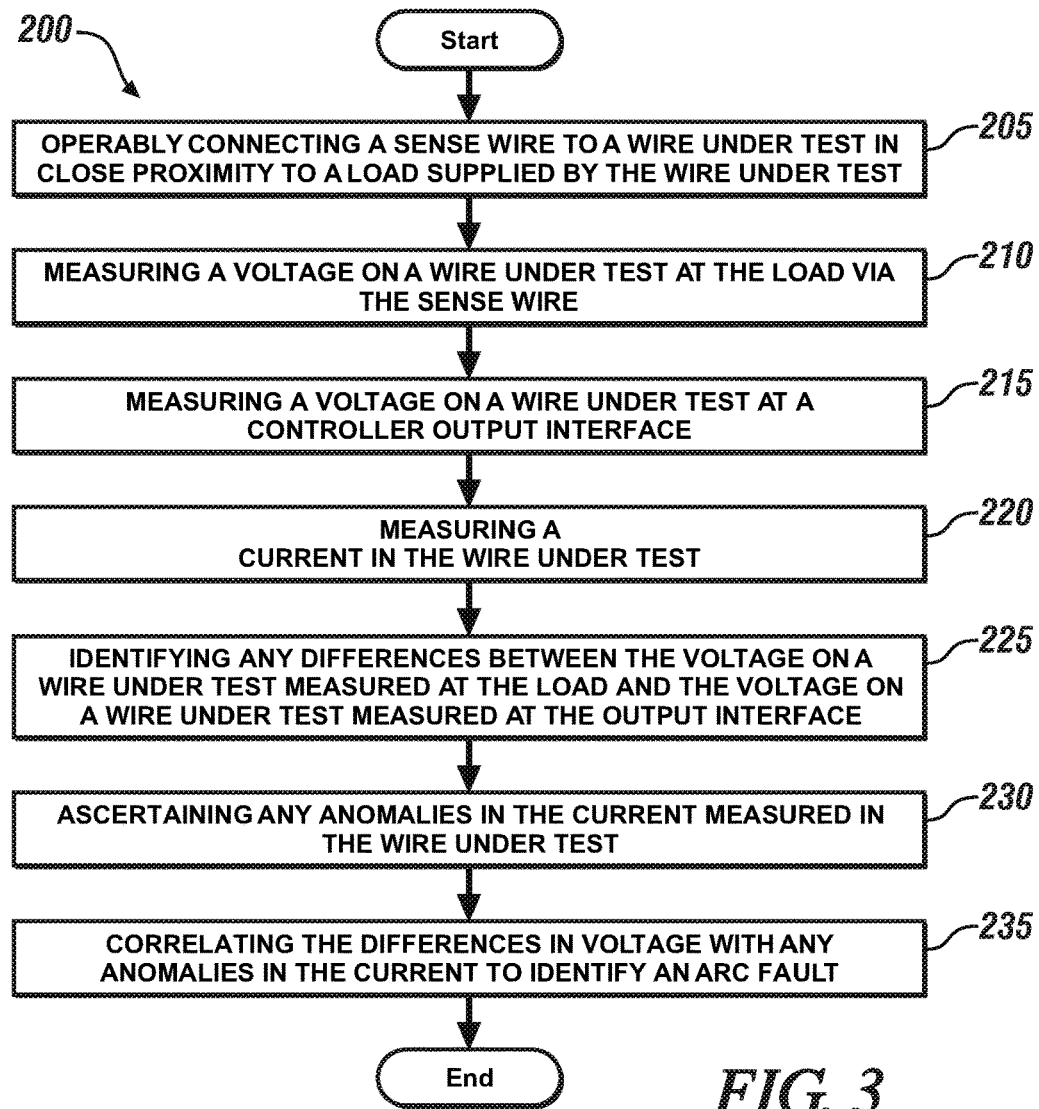
FIG. 3 depicts a simplified flowchart depicting the method of identifying an arc fault in a wire in accordance with an embodiment.

FIG. 3 depicts a flowchart of a method 200 of detecting arc faults in a control system with a controller 16 supplying power or a control system to a load 60 in accordance with an embodiment. The description on FIG. 3 will refer, from time to time, to elements in FIGS. 1 and 2. Turning to the method 200, the method 200 initiates at process block 205 where a sense wire 30 is operably connected to a wire under test 62 in close proximity to a load 60. At process step 210 the method 200 continues with measuring a voltage on a wire under test 62 at the load 60 via the sense wire 30. The method also includes measuring a voltage on the wire under test 62 at an interface output 66 to the controller 16 as depicted at process step 215. In addition, the method 200 includes measuring a current supplied to the load 60 as depicted at process step 220. The methods 200 continues with identifying differences between the voltage on the wire under test 62 measured at the load 60 and the voltage on the wire under test 62 measured at the output interface 66 as depicted at process step 225. Furthermore, the method 200 also includes ascertaining any anomalies in the current measured in the wire under test 62 as depicted at process step 230. Anomalies can include transients, large variations spikes and the like. At process step 235, the method 200 concludes with correlating any differences in the measured voltages with any current anomalies ascertained to identify an arc fault.

It should be appreciated that while previous methods have worked satisfactorily for parallel arc fault detection (e.g., short to ground or another circuit), they and not very satisfactory for series arc fault detection. Advantageously the described embodiments improve on prior detection techniques by coupling the differential voltage tests of the arc voltage sense circuit 40 with the measured current variations from the current sense circuit 50. Moreover, it should also be noted that the existing methods associated with detecting current variations work less effectively as the line voltage increases (for example for 270 VDC power vs 28 VDC power). Finally, by routing the sense wire 30*a* along an alternate path as indicated in selected embodiments, additional protection of the fault detection is provided. Any fault will be less likely to affect the power wire, e.g. the wire under test 62 and sense wire 30 at the same time.

Figure 4:
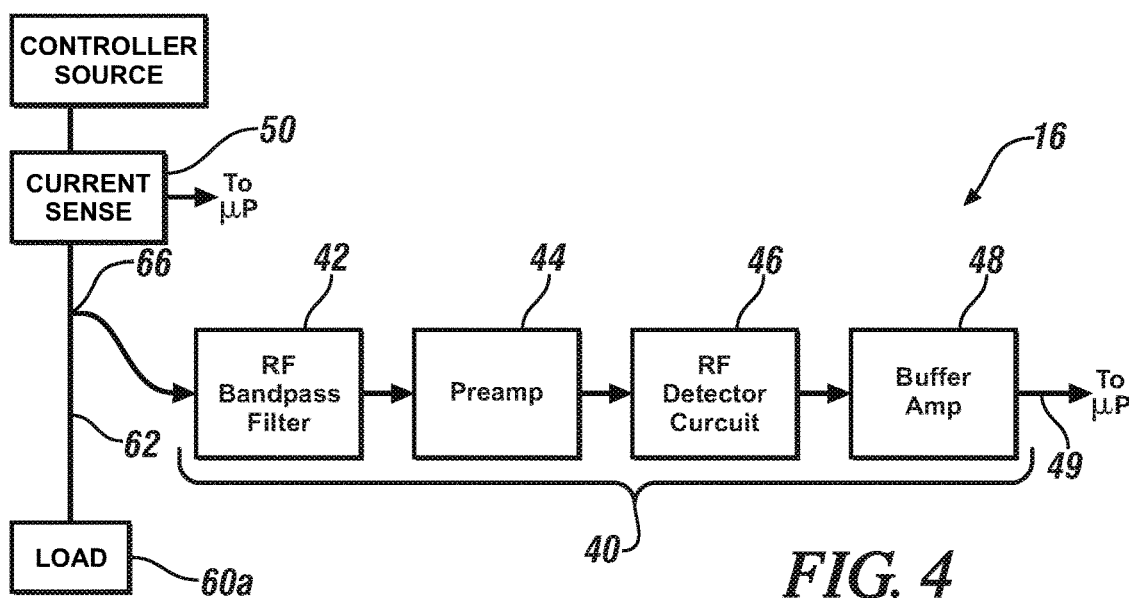
FIG. 4 depicts a partial diagram of a system for detecting an arc fault in a wire connected to a load in accordance with an embodiment.

FIG. 4 depicts a simplified block diagram of another system and process as part of controller 16 for detecting arc faults in accordance with an embodiment. In an embodiment, the voltage on the wire under test 62 is monitored by an arc fault sense circuit 40 as part of the controller 16. In an embodiment, the voltage is monitored at the controller output interface 66 as described herein.

Series and parallel arcs faults have been found to create radio frequency (RF) noise over a wide spectral range of about 1 Mhz to 150 Mhz, but in particular in the range of 10 Mhz to about 40 Mhz. The described embodiments of an arc fault detection circuit 40 employ a filter 42 feeding a one stage preamplifier 44 that then is directed to an RF detector 46 and finally to an output buffer 48. Then the output of this circuit is fed into the processor of the controller 16 for monitoring. In an embodiment, the filter 42 is an RF band pass filter with a band pass range of about 10 MHz to 40 MHz, although other ranges are possible. The range is selected to correspond with the spectral content exhibited by the arc fault conducted on the wire under test 62. To facilitate monitoring and further processing the arc fault detection circuit 40 also includes a preamplifier 44 to amplify the filtered spectral content. In an embodiment, a standard RF amplifier may be employed provided it exhibits sufficient operational bandwidth and linearity. The preamplifier 44 may also contain a filter network to help select the appropriate frequency bands for monitoring. An RF Detector circuit 46 includes a standardized logarithmic amplifier 46 to further amplify the RF content gleaned from the measured voltage data from the wire under test 62 and glean additional information regarding the signal strength in the frequency range of interest. The logarithmic amplifiers exhibits an output that represents a many-decade high dynamic range of high-frequency input signal amplitudes by a relatively narrow output range signal, thereby correlating to the "energy" in the high frequency content of the information in band pass range. This information is then buffered by a buffer amplifier 48 and then provided to the microprocessor of the controller 16 for processing in accordance with one or more detections methods.

In the microprocessor additional software logic may be used to look for specific time domain characteristics of the arc such as length of time for detected noise and repeating patterns. The described embodiments provide a clear indication through RF detection as to when a series arc fault or parallel arc fault is occurring. In one embodiment, when the output of the detection circuit 40 exceeds a selected threshold, it is construed as the presence of an arc fault. In another embodiment, the output of the arc fault detection circuit 40 can be correlated with the detected transients from the current sense circuit 50 to identify the presence of an arc fault with improved accuracy and reliability when compared to existing techniques. It should also be noted that advantageously, the described embodiments do not depend on current droop on series arc faults and are more immune to the effects of higher voltages as it directly detects the signature noise from the arc itself. In addition, the detection circuit is small and low cost and readily implemented in a hardware preprocessing configuration.

Figure 5A:
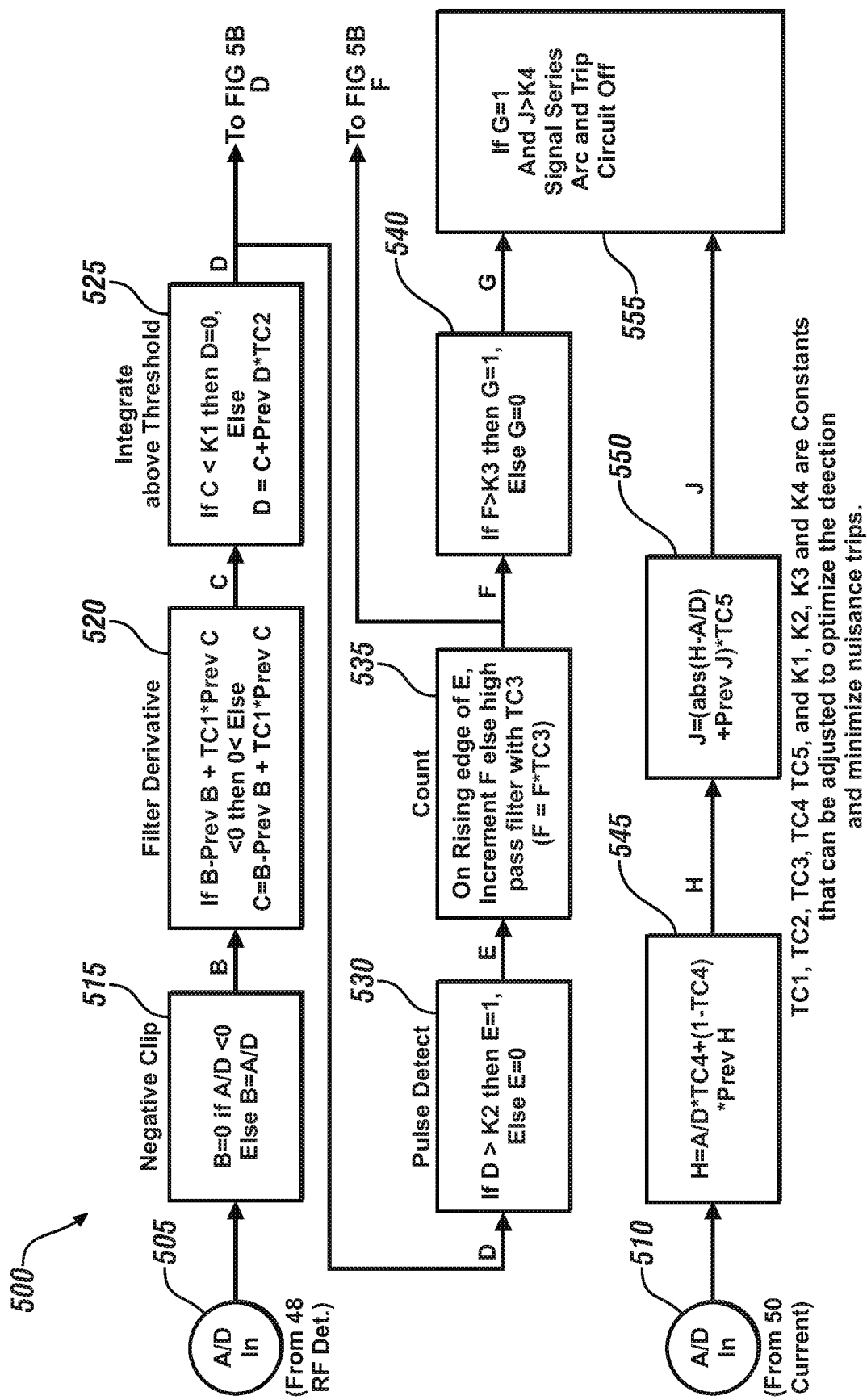
FIG. 5A depicts a simplified flowchart depicting the method of identifying an series arc fault in a wire in accordance with an embodiment.
Figure 5B:
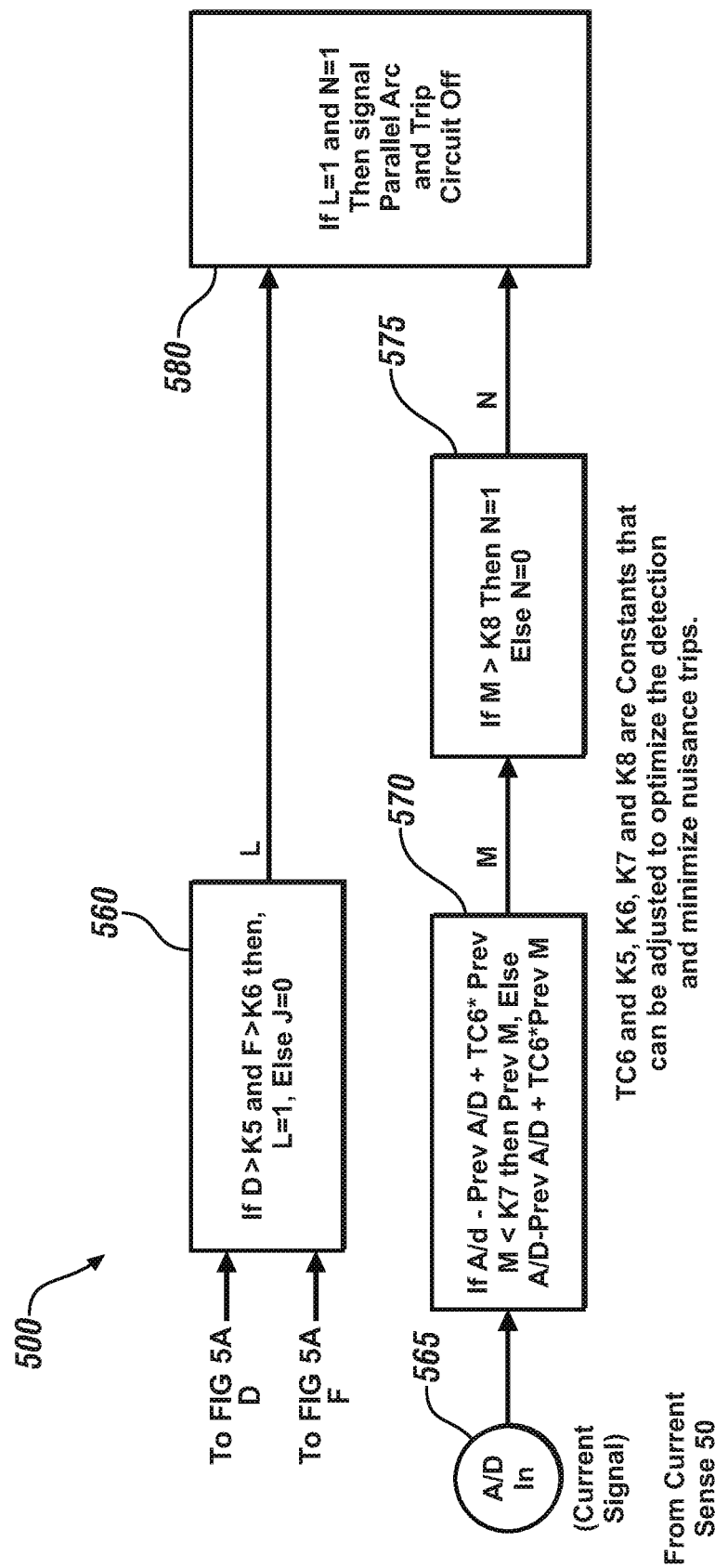
FIG. 5B depicts a simplified flowchart depicting the method of identifying a parallel arc fault in a wire in accordance with an embodiment.

FIG. 5A depicts another flowchart of a method 500 of detecting arc faults in a control system with a controller 16 supplying power or control signals to a load 60 via a wire under test 62 in accordance with an embodiment. The description on FIG. 5 will refer, from time to time, to elements in FIGS. 1-4. The various constants and filter time constants for both FIGS. 5*a* and 5*b* are empirically derived experimentally by looking at the characteristics of captured test data for currents and RF energy and their waveforms. For example, the 'integrate above threshold value' is selected to ignore low level noise from the circuit and from A/D sampling.

The method 500 initiates with system and processes described with respect to FIG. 4 and identifying the relevant RF content and current sensing. In this embodiment, the method 500 initiates at process block 505 with receiving, by the processor of the controller 16 signals indicative of relevant RF measurements and spectral content from the wire under test 62 (e.g. the output 49 of buffer amplifier 48 (FIG. 4)). Similarly, the process 500 also includes receiving a signal indicative of the current measurements from the current sensing circuit 50 (FIG. 4) as described herein at process step 510. At process step 515 the method 500 continues with a negative clipping function. The negative clipping function is configured to simplify further processing by limiting the sign of the spectral content envelope signals from the RF detector circuit 46 (FIG. 4) to positive values. The negative clipping function captures only increases in RF energy and ensures avoiding inadvertently decaying the result of the following accumulation during times when no noise is detected, which, in turn, ensures that the accumulation integrator to have the right decay time constant. The method 500 continues at process step 520 with applying a filter derivative to identify changes in the RF content of the process voltage from the wire under test 62. The derivative identifies the changes in the original spectral content and in particular, whether the frequency band of interest (10 Mhz to 50 Mhz) has had a significant positive change in amplitude. This feature captures the changing amplitude of noise that occurs during a typical arcing process and differentiates it from constant background noise. At process step 525, the changes that are identified by the derivative function at process step 520 are integrated above a selected threshold. The integration establishes and accumulates difference pulses above an established selected threshold. The threshold defines a limit for circuit sampling DC noise at the A/D thus only detecting significant RF content changes in the integration. Continuing with FIG. 5 and the method 500, at process step 530, the resulting pulses that exceed another selected threshold are evaluated, flagged and counted as shown at process step 535. If the count of flags (pulses that exceeded the threshold) accumulates such that it exceeds another selected threshold, it is indicative of the spectral content from the RF detection 42 (FIG. 4) as depicted at process step 540 meeting selected characteristics indicative of an arc fault.

Continuing with FIG. 5A and the current sense branch of the flow chart, the current in the wire under test 62 as measured by the current sense circuit 50 is received at block 510. This measured current is received at process step 545, which provides a high frequency filtering function that formulates a pulse for instances where the measured current exhibits partial dropouts. That is, in instances where measured transient breaks in the current delivered to the wire under test 62. At process step 550 the pulses are integrated to establish pulses indicative of the instances of the current drop outs. Finally, turning to process block 555, if the flag from process step 540 is set indicating the presence of the selected RF signature on the wire under test 62 exceeding the selected threshold, and the cumulative pulses from process block 550 exceed a selected threshold, indicating that the sensed current is indicative of a potential fault, then a series arc fault is indicated by process block 555.

Turning to FIG. 5B and the description of the method 500 continues with the process steps for detecting parallel arc faults. The method 500 continues at process blocks 560 with receiving the integrated, accumulated pulses and the pulse count from process steps 525 and 535 respectively indicative of relevant RF measurements and spectral content from the wire under test 62. If the value of the integrated, accumulated pulses exceeds a selected threshold and the pulse count from process step 535 exceeds another selected threshold, then a true flag is set indicating a potential arc fault condition has been detected. Meanwhile, at process step 570, the current received from the current sense circuit 50 is differentiated and then subsequently integrated to accumulate all instances of current transients. Once again, as depicted at process step 575, if the accumulated instances of current transients exceeds a selected threshold a true flag is set for the current tests. Finally, turning to process block 580 if the flag from process step 560 is set indicating the presence of the selected RF signature on the wire under test 62 exceeding the selected threshold, and the cumulative pulses from process block 575 exceed a selected threshold, indicating that the sensed current is indicative of a potential fault, then a parallel arc fault is indicated.

It should be appreciated that the methodologies described with respect to FIGS. 5A and 5B may readily be applied to the embodiments employing sense wires ad described herein. In those instances, the processing may be part of the correlation between the voltage measured in the sense wires and the current in the wire under test. Furthermore, it should further be appreciated that various embodiments as described herein may be combined in whole or in part with other embodiments to facilitate various implementations for detecting and identifying both series and parallel arc faults. It should also be appreciated, that each of the selected thresholds may be selected based on actual measurements of various arc configurations and selected to "optimize" the detection and minimize nuisance tripping based on false positive determinations. It should also be appreciated that in the described embodiments, this optimization is accomplished to center the results between the point where excess noise would be picked up and the point where the actual arc would not be detected. The various constants and filter time constants may empirically derived experimentally based on the characteristics of captured test data for measured voltages on the sense wires or wires under test as well as the currents and RF energy and their waveforms. For example, the 'integrate above threshold value' is selected to ignore low level noise from the circuit and from A/D sampling employed in the processing. In another example, the filter derivative time constant is selected to allow closely spaced RF pulses to be later counted together but to filter out pulses that are spaced widely apart. Likewise, the pulse detect is selected as a threshold to see adequate RF energy to consider it a true pulse.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof. For the purposes of this disclosure, it is further understood that the terms "inboard" and "outboard" can be used interchangeably, unless context dictates otherwise.

The present embodiments may be a system, a method, and/or a computer program product at any possible technical detail level of integration. The computer program product may include a computer readable storage medium (or media) having computer readable program instructions thereon for causing a processor to carry out aspects of the present disclosure.

The flowchart and block diagrams in the figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted, that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

What is claimed is:

1. A method of identifying an arc fault in a first wire operably connected between a controller and a load, the method comprising:
   operably connecting a first sense wire to the first wire connected to a first load supplied by the controller via the first wire;
   measuring a first voltage on the first wire at the first load via the first sense wire;
   measuring a second voltage on the first wire at a first output interface of the controller;
   measuring a first current in the first wire;
   identifying any differences between the first voltage on the first wire measured at the first load and the second voltage on the first wire measured at the first output interface;
   ascertaining any anomalies in the first current measured in the first wire; and
   correlating the differences between the first voltage and the second voltage with any anomalies in the first current to identify an arc fault;

wherein the correlating further includes:
receiving a signal indicative of the envelope of the spectral content on the first wire in a selected frequency range:
receiving the signal indicative of current in the first wire based on the measuring;
applying a negative clipping function to the signal to form a positive envelope signal;
applying a derivative function to the positive envelope signal the derivative function yielding a pulse signal indicative of changes in the positive envelope signal;
if the pulse signal exceeds a first selected threshold, integrating the pulse signal to yield an accumulated pulse signal; otherwise set the accumulated pulse signal to zero;
if the accumulated pulse signal exceeds a second threshold set a first flag as true indicating a selected amount of information indicative of an arc fault has been acquired;
counting the occurrences the first flag is set as true;
if the count exceeds a selected third threshold, set a second flag indicating the that
the spectral content as measured from the wire indicates a possible series arc fault;
filtering the signal indicative of the current in the first wire to formulate a pulse associated with when the measured current exhibits an interruption;
accumulating instances when the measured current exhibits an interruption based on the pulses;
if the accumulated instances when the measured current exhibits an interruption exceeds a fourth selected threshold and a second flag indicating that the spectral content as measured from the first wire indicates a possible series arc faults is set then identify a series arc fault in the first wire.

2. The method of identifying an arc fault as recited in claim 1, further including routing the first sense wire in parallel with the first wire.

3. The method of identifying an arc fault as recited in claim 1, wherein the first sense wire is a shield associated with the first wire.

4. The method of identifying an arc fault as recited in claim 1, further including routing the sense first wire with another wire.

5. The method of identifying an arc fault as recited in claim 1, wherein the first sense wire is connected to the first wire in close proximity to the first load.

6. The method of identifying an arc fault as recited in claim 1, further including:
operably connecting a second sense wire to a second wire connected to a second load supplied by the controller via the second wire;
measuring a third voltage on the second wire at the load via the second sense wire;
measuring a fourth voltage on the second wire at a second output interface of the controller;
measuring a second current in the second wire;
identifying any differences between the third voltage on the second wire measured at the load and the fourth voltage on the second wire measured at the second output interface;
ascertaining any anomalies in the second current measured in the second wire; and
correlating the differences between the third voltage and the fourth voltage with any anomalies in the second current to identify an arc fault.

7. The method of identifying an arc fault as recited in claim 6, wherein the first load and the second load are the same.

8. The method of identifying an arc fault as recited in claim 6, further including routing the first sense wire in parallel with the second wire.

9. The method of identifying an arc fault as recited in claim 6, further including routing the second sense wire with the first wire.

10. The method of identifying an arc fault as recited in claim 6, wherein the second sense wire is connected to the second wire in close proximity to the second load.

11. The method of identifying an arc fault as recited in claim 6, further including a third wire and a third sense wire, wherein the load is a three phase load.

12. The method for identifying an arc fault as recited in claim 1 further including the controller further operable to execute a method of identifying an arc fault in a wire further comprising:
if the accumulated pulse signal exceeds a fifth selected threshold and the count exceeds a selected sixth selected threshold, set a third flag indicating the that the spectral content as measured from the wire indicates a possible parallel arc fault;
filtering the signal indicative of the current in the wire to formulate pulses associated with when the measured current exhibits an interruption;
if the pulses exceed a seventh selected threshold, accumulating instances when the measured current exhibits an interruption based on the pulses;
if the accumulated instances when the measured current exhibits an interruption exceeds an eighth selected threshold setting a fourth flag indicative of a current fault;
if the third flag indicating the that the spectral content as measured from the wire indicates a possible parallel arc fault is set and the fourth flag indicating a sufficient current fault is set, identify a parallel arc fault for the wire.

13. The method of identifying an arc fault as recited in claim 1, wherein the receiving a signal indicative of the envelope of the spectral content on the wire under test in a selected frequency range is based on:
filtering the first voltage on the first wire with a bandpass filter having a selected pass band to select and retain spectral content, wherein the pass band frequency range in the range of about 10 MHz to about 40 MHz;
amplifying the retained spectral content with a linear preamplifier;
identifying an envelope of the amplified retained spectral content by applying a logarithmic amplifier to the amplified retained spectral content, the envelope indicative of the RF energy content of the spectral content in the pass band;
wherein the controller incudes a current sense function, the current sense function including measuring a first current in the first wire;
correlating changes in the first current with a characteristic of the amplified retained spectral content to identify an arc fault, wherein the characteristic includes a buffered envelope as a signal indicative of the amount of energy in the selected pass band frequency range.

14. A system for identifying an arc fault in a wire, the system comprising:
a controller operably connected to a first load via first wire; the controller configured to supply a current to the first load via the first wire;

a first sense wire operably connected to the first wire, the first sense wire operably connected to the controller;

wherein the controller includes a voltage sense function and a current sensing function, the controller operable to execute a process to:

measure a first voltage on the first wire at the first load via the first sense wire;

measure a second voltage on the first wire at a first output interface of the controller;

measure a first current in the first wire;

identify any differences between the first voltage on the first wire measured at the first load and the second voltage on the first wire measure at the first output interface;

ascertain any anomalies in the first current measured in the first wire; and correlate the differences between the first voltage and the second with any anomalies in the current to identify an arc fault;

wherein correlating the differences between the first voltage and the second with any anomalies in the current to identify an arc fault in the first wire further includes:

receiving a signal indicative of the envelope of the spectral content on the first wire in a selected frequency range;

receiving a signal indicative of current in the first wire;

applying a negative clipping function to the signal to form a positive envelope signal;

applying a derivative function to the positive envelope signal the derivative function yielding a pulse signal indicative of changes in the positive envelope signal;

if the pulse signal exceeds a first selected threshold, integrating the pulse signal to yield an accumulated pulse signal; otherwise set the accumulated pulse signal to zero;

if the accumulated pulse signal exceeds a second threshold set a first flag as true indicating a selected amount of information indicative of an arc fault has been acquired;

counting the occurrences when the first flag is set as true;

if the count exceeds a selected third threshold, set a second flag indicating the that the spectral content as measured from the first wire indicates a possible series arc fault;

filtering the signal indicative of the current in the first wire to formulate a pulse associated with when the measured current exhibits an interruption;

accumulating instances when the measured current exhibits an interruption based on the pulses;

if the accumulated instances when the measured current exhibits an interruption exceeds a fourth selected threshold and a second flag indicating the that the spectral content as measured from the wire indicates a possible series arc faults is set, then identify a series arc fault in the wire.

15. The system for identifying an arc fault as recited in claim 14, wherein the first sense wire is routed in parallel with the first wire.

16. The system for identifying an arc fault as recited in claim 14, wherein the first sense wire is a shield associated with the first wire.

17. The system for identifying an arc fault as recited in claim 14, wherein the first sense wire is routed with another wire.

18. The system for identifying an arc fault as recited in claim 14, wherein the first sense wire is connected to the first wire in close proximity to the first load.

19. The system for identifying an arc fault as recited in claim 14, further including:

a second sense wire operably connected to a second wire operably connected to a second load, the second wire supplied by the controller, the second sense wire in operable communication with the controller;

wherein the controller is also operable to execute a method to:

measure a third voltage on the second wire at the load via the second sense wire;

measure a fourth voltage on the second wire at a second output interface of the controller;

measure a second current in the second wire;

identify any differences between the third voltage on the second wire measured at the load and the fourth voltage on the second wire measured at the second output interface;

ascertain any anomalies in the second current measured in the second wire; and correlate the differences between the third voltage and the fourth voltage with any anomalies in the second current to identify an arc fault.

20. The system for identifying an arc fault as recited in claim 19, wherein the first load and the second load are the same.

21. The system for identifying an arc fault as recited in claim 19, further including routing the first sense wire in parallel with the second wire.

22. The system for identifying an arc fault as recited in claim 19, further including routing the second sense wire with the first wire.

23. The system for identifying an arc fault as recited in claim 19, wherein the second sense wire is connected in close proximity to the second load.

24. The system for identifying an arc fault as recited in claim 19, further including a third wire and a third sense wire, wherein the load is a three phase load.

25. The system for identifying an arc fault as recited in claim 14 wherein the controller is further operable to execute a method of identifying an arc fault in a wire further comprising:

if the accumulated pulse signal exceeds a fifth selected threshold and the count exceeds a selected sixth selected threshold, set a third flag indicating the that the spectral content as measured from the first wire indicates a possible parallel arc fault;

filtering the signal indicative of the current in the wire to formulate a pulse associated with when the measured current exhibits an interruption;

if the pulses exceed a seventh selected threshold, accumulating instances when the measured current exhibits an interruption based on the pulses;

if the accumulated instances when the measured current exhibits an interruption exceeds an eighth selected threshold setting a fourth flag indicative of a current fault;

if the third flag indicating that the spectral content as measured from the first wire indicates a possible parallel arc fault is set and the fourth flag indicating a sufficient current fault is set, identify a parallel arc fault for the first wire.

26. The system for identifying an arc fault as recited in claim 14, wherein the controller receiving a signal indicative of the envelope of the spectral content on the wire in a selected frequency range further includes:

a voltage sense function configured to measure a voltage on the first wire, the controller operable to:

filter the first voltage on the first wire with a bandpass filter having a selected pass band frequency range to select and retain spectral content;
amplify the retained spectral content with a linear preamplifier;
identify an envelope of the amplified retained spectral content by applying a logarithmic amplifier to the amplified retained spectral content, the envelope indicative of the RF energy content of the spectral content in the pass band of the voltage on the first wire;
a current sense function, the current sense function operable to measure a first current in the first wire;
correlating changes in the first current with a characteristic of the amplified retained spectral content to identify an arc fault, wherein the characteristic includes a buffered envelope as a signal indicative of the amount of energy in the selected passband frequency range.

\* \* \* \* \*